(12) United States Patent
Nakao et al.

(10) Patent No.: US 10,573,810 B2
(45) Date of Patent: Feb. 25, 2020

(54) SEMICONDUCTOR MEMORY DEVICE

(71) Applicant: PANASONIC INTELLECTUAL PROPERTY MANAGEMENT CO., LTD., Osaka (JP)

(72) Inventors: Yoshiaki Nakao, Kanagawa (JP); Kazuyuki Kouno, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/798,283

(22) Filed: Oct. 30, 2017

(65) Prior Publication Data

US 2018/0069177 A1 Mar. 8, 2018

Related U.S. Application Data

(63) Continuation of application No. PCT/JP2016/001983, filed on Apr. 12, 2016.

(30) Foreign Application Priority Data

May 13, 2015 (JP) ................................. 2015-098293

(51) Int. Cl.
*H01L 27/105* (2006.01)
*H01L 45/00* (2006.01)
(Continued)

(52) U.S. Cl.
CPC ............ *H01L 45/1253* (2013.01); *G11C 7/14* (2013.01); *G11C 13/003* (2013.01);
(Continued)

(58) Field of Classification Search
CPC ............... H01L 45/1253; H01L 27/105; H01L 27/2436; H01L 27/2463; H01L 45/00;
(Continued)

(56) References Cited

U.S. PATENT DOCUMENTS

| 2011/0063889 A1 | 3/2011 | Fukano |
| 2013/0094279 A1 | 4/2013 | Kobatake |

(Continued)

FOREIGN PATENT DOCUMENTS

| JP | 2011-061091 A | 3/2011 |
| JP | 2011-138581 A | 7/2011 |

(Continued)

OTHER PUBLICATIONS

International Search Report and Written Opinion issued in International Patent Application No. PCT/JP2016/001983, dated Jun. 28, 2016; with partial English translation.

*Primary Examiner* — Asok K Sarkar
*Assistant Examiner* — Dmitriy Yemelyanov
(74) *Attorney, Agent, or Firm* — McDermott Will & Emery LLP

(57) ABSTRACT

A semiconductor memory device includes a first select line and a second select line. A first memory element among a plurality of memory elements has a first top electrode and a first bottom electrode. The first top electrode is connected to the first select line and the first bottom electrode is connected to the second select line. A second memory element among the plurality of memory elements, which is disposed adjacent to the first memory element, has a second top electrode and a second bottom electrode. The second top electrode is connected to the first select line, and the second bottom electrode is connected to the first select line without passing a resistive element of a memory element other than the second memory element.

12 Claims, 4 Drawing Sheets

(51) Int. Cl.
    *G11C 13/00*     (2006.01)
    *G11C 7/14*     (2006.01)
    *H01L 27/24*     (2006.01)

(52) U.S. Cl.
    CPC ...... *G11C 13/0033* (2013.01); *G11C 13/0064* (2013.01); *H01L 27/105* (2013.01); *H01L 27/2409* (2013.01); *H01L 27/2436* (2013.01); *H01L 27/2463* (2013.01); *H01L 45/1233* (2013.01); *G11C 2213/75* (2013.01); *G11C 2213/79* (2013.01)

(58) Field of Classification Search
    CPC ....... H01L 45/1233; H01L 49/00; G11C 7/14; G11C 13/003; G11C 13/0033; G11C 13/0064
    See application file for complete search history.

(56) References Cited

U.S. PATENT DOCUMENTS

| | | |
|---|---|---|
| 2014/0092665 A1 | 4/2014 | Ueda et al. |
| 2014/0126265 A1 | 5/2014 | Lee et al. |
| 2015/0187393 A1* | 7/2015 | Ueda .................. G11C 13/0004 365/66 |

FOREIGN PATENT DOCUMENTS

| | | | |
|---|---|---|---|
| JP | 2013-089662 A | 5/2013 | |
| JP | 2014-093530 A | 5/2014 | |
| WO | 2013/005364 A1 | 1/2013 | |
| WO | WO-2014068961 A1 * | 5/2014 | ......... G11C 13/0004 |

\* cited by examiner

US 10,573,810 B2

SEMICONDUCTOR MEMORY DEVICE

CROSS REFERENCE TO RELATED APPLICATIONS

This application is a U.S. continuation application of PCT International Patent Application Number PCT/JP2016/001983 filed on Apr. 12, 2016, claiming the benefit of priority of Japanese Patent Application Number 2015-098293 filed on May 13, 2015, the entire contents of which are hereby incorporated by reference.

BACKGROUND

1. Technical Field

The present disclosure relates to semiconductor memory devices, and particularly relates to a semiconductor memory device having a configuration for detecting a leak path.

2. Description of the Related Art

A semiconductor memory device is used for a digital device as represented by a computer. With a recent increase in the amount of information to be handled and also with an increase in the length of time during which the semiconductor memory device is used, there has been a demand for high capacity and low power consumption of the semiconductor memory device.

For example, a resistive random access memory (ReRAM) that has recently received attention is a semiconductor memory which allows higher-speed operation with lower power consumption compared to a conventional flash memory, and is characterized in that a resistive element whose resistance value varies based on electrical signals is used in a memory element. Such ReRAM holds data such as "1" and "0" as information indicating resistance change. In addition, the resistive elements that constitute a ReRAM are in the state without filaments which become conductive paths after the formation of the filaments. It is thus necessary to perform a forming operation onto the resistive elements for the filament formation.

A semiconductor memory device including the above-described ReRAM has a general configuration in which word lines and bit lines are disposed to be mutually orthogonal, and a1T1R memory cell in which a MOS transistor and a memory element are connected in series is disposed at the point of intersection. In the semiconductor memory device, such memory cells are arranged in a matrix according to the capacity of the semiconductor memory device. Moreover, as an effective way to prevent the quality deterioration of a semiconductor memory device due to its miniaturization, it is widely known to dispose, in the periphery of the memory cells arranged in a matrix, dummy memory elements which do not function as memory elements, for enhancing the uniformity of the layout of the memory cells (see Japanese Unexamined Patent Application Publication No. 2011-138581).

SUMMARY

In order to prevent a memory element from causing malfunction and degradation in reliability due to unintentional resistance and volume load given to the memory element, in a 1T1R memory cell array, a method for detecting a leak path between the adjacent memory elements has been provided.

In the case of using a memory cell functioning as a memory element, a word line and a bit line are connected to the memory cell. Therefore, a leak path can be detected between the adjacent memory elements by changing the resistance state of the memory cell to a low resistance state. However, in the case of using a dummy memory element which does not need to write and read data, at least one of a word line and a bit line is not connected in some cases. In this case, since it is not possible to change the resistance state of the dummy memory element to a low resistance state, a problem is that a leak path cannot be found between the adjacent memory elements. As a result, a trouble cannot be detected even in the case where a memory element to which unintentional resistance and volume load are given is present, which causes the occurrence of malfunction and the degradation in reliability.

The present disclosure therefore aims to provide a semiconductor memory device with which the occurrence of malfunction and the degradation in reliability can be reduced.

In order to solve the problem described above, a semiconductor memory device according to one aspect of the present disclosure is a semiconductor memory device including: a plurality of memory elements each having a top electrode, a bottom electrode disposed below the top electrode, and a resistive element disposed between the top electrode and the bottom electrode; a first select line; and a second select line. A first memory element among the plurality of memory elements has a first top electrode as the top electrode and a first bottom electrode as the bottom electrode, and the first top electrode is connected to the first select line and the first bottom electrode is connected to the second select line. A second memory element among the plurality of memory elements, which is disposed adjacent to the first memory element, has a second top electrode as the top electrode and a second bottom electrode as the bottom electrode. The second top electrode is connected to the first select line, and the second bottom electrode is connected to the first select line without passing a resistive element of a memory element other than the second memory element.

With the semiconductor memory device according to the present disclosure, it is possible to reduce the occurrence of malfunction and the degradation in reliability.

DETAILED DESCRIPTION OF THE EMBODIMENTS (Underlying Knowledge Forming Basis of the Present Disclosure)

First, a knowledge forming a basis of the present disclosure will be described.

Figure 1:
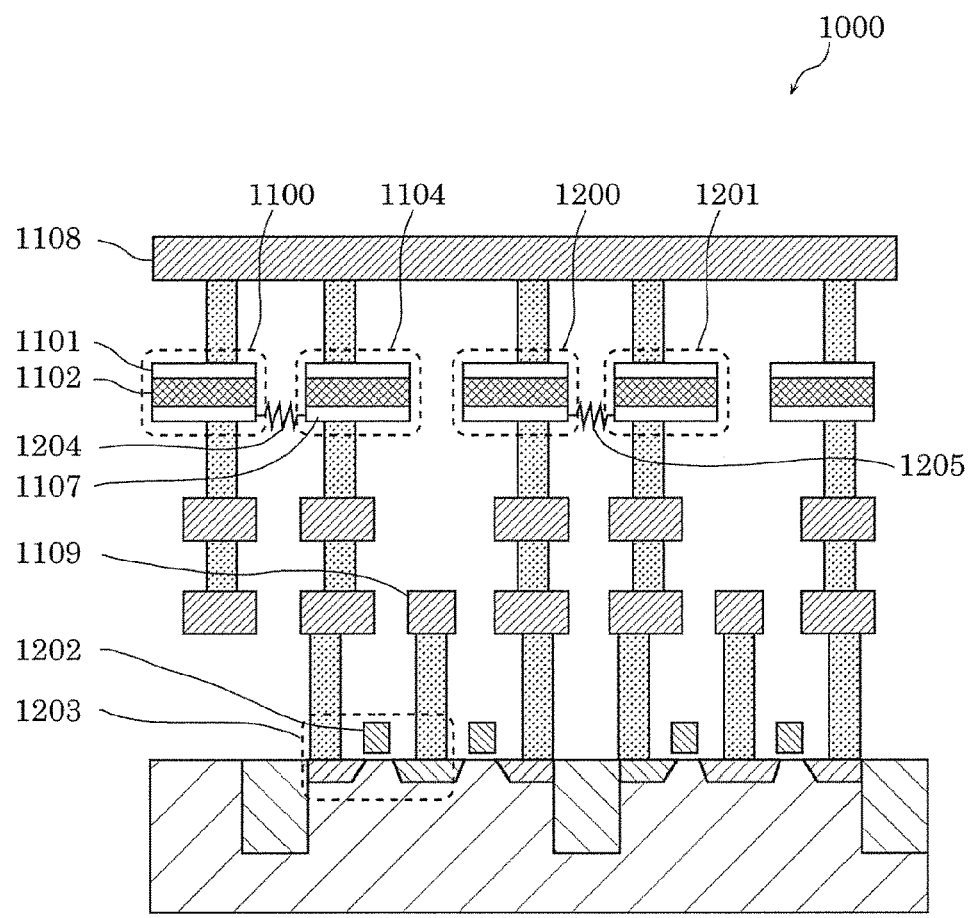
FIG. 1 is a cross-sectional view of a semiconductor memory device, for illustrating in detail a problem to be solved by the present disclosure.

FIG. 1 shows a cross-sectional view of semiconductor memory device 1000 having a 1T1R memory cell array in which plural memory elements are arranged. In semiconductor memory device 1000 shown in FIG. 1, first memory element 1100 is a dummy memory element which does not function as a memory element, and second memory element 1104, third memory element 1200, and fourth memory element 1201 are memory cells which function as memory elements. All the memory elements (1100, 1104, 1200, and 1201) are in the state before a forming operation is performed. In addition, first memory element 1100 is not connected to second select line 1109 and is a memory element onto which a forming operation cannot be performed.

In semiconductor memory device 1000 having such a configuration, in the case where second leak path 1205 is present between third memory element 1200 and fourth memory element 1201, as shown in FIG. 1, there is a way to detect a leak path by applying electrical signals to fourth memory element 1201 after the resistance state of third memory element 1200 has been changed to a low resistance state by way of electrical signals and checking whether the resistance state of third memory element 1200 is changed as has been desired. However, in the case where first leak path 1204 is present between second memory element 1104 and first memory element 1100 onto which a forming operation cannot be performed, first memory element 1100, for which a conductive path has not been formed through a forming operation, has no means to change its resistance state to a low resistance state, and cannot thereby detect a leak path. Accordingly, a problem is that unintentional resistance and volume load are given to second memory element 1104, which causes malfunction and degradation in reliability.

The present disclosure, therefore, is to solve the problem of failing to detect first leak path 1204 that is present between first memory element 1100 and second memory element 1104 and thereby causing degradation in quality, as will be described below in detail. Accordingly, with the configuration of semiconductor memory device 1000 having a means to connect second bottom electrode 1107 and first select line 1108 without passing first resistive element 1102, it is possible to detect first leak path 1204 between first memory element 1100 and second memory element 1104 without changing the resistance state of first memory element 1100 to a low resistance state.

Hereinafter, the embodiments according to the present disclosure will be described with reference to the drawings. In some cases, the substantially same elements are denoted by the same numerals and the description thereof may be abbreviated. In addition, when manufacturing methods are substantially the same through the embodiments, the description of the methods may be abbreviated in some cases.

Moreover, the present disclosure shall not be limited to the following embodiments. Any combination of the embodiments according to the present disclosure is possible.

Each of the embodiments described below shows a concrete example of the present disclosure. Thus, values, shapes, materials, structural elements, the arrangement and connection of the structural elements, etc. shown in the following embodiments are mere examples, and therefore do not limit the inventive concept of the present disclosure. The present disclosure shall be identified by the scope of claims. Among the structural elements described in the following embodiments, the structural elements not recited in any one of independent claims are not indispensable for achieving the aim of the present disclosure, however, are described as more preferable embodiments.

Note that the semiconductor memory device described below is illustrated using a ReRAM, however, the semiconductor memory device shall not be limited to this.

Embodiment 1

Figure 2:
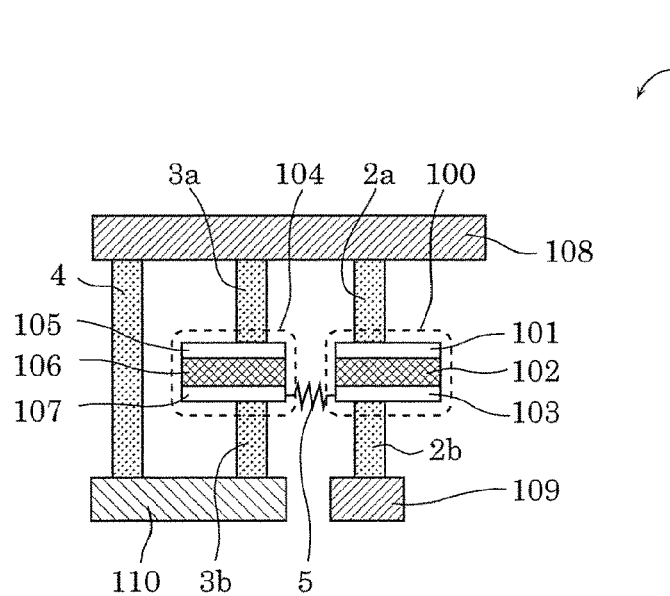
FIG. 2 is a cross-sectional view of a semiconductor memory device according to Embodiment 1 of the present disclosure.

FIG. 2 shows a cross-sectional view of semiconductor memory device 10 according to Embodiment 1.

As shown in FIG. 2, semiconductor memory device 10 includes first memory element 100, second memory element 104, first select line 108, second select line 109, conductors 2a, 2b, 3a, 3b, and 4, and first conductive layer 110. First conductive layer 110 is a metal layer made of, for instance, copper.

First memory element 100 has first top electrode 101, first bottom electrode 103, and first resistive element 102 disposed between first top electrode 101 and first bottom electrode 103. Second memory element 104 disposed adjacent to first memory element 100 has second top electrode 105, second bottom electrode 107, and second resistive element 106 disposed between second top electrode 105 and second bottom electrode 107.

First top electrode 101 is connected via conductor 2a to first select line 108 which is a bit line. Second top electrode 105 is connected via conductor 3a to first select line 108 which is a bit line. First top electrode 101 and second top electrode 105 are connected to same first select line 108.

First bottom electrode 103 is connected via conductor 2b to second select line 109 which is a source line. Second bottom electrode 107 is connected to first conductive layer 110 via conductor 3b. First conductive layer 110 is further connected to first select line 108 via conductor 4. Namely, second bottom electrode 107 is connected to first select line 108 via conductors 3b and 4, and first conductive layer 110. In other words, second bottom electrode 107 is connected to first select line 108 without passing second resistive element 106 and a resistive element of a memory element other than second memory element 104.

Semiconductor memory device 10 shown in FIG. 2 is in the state before a forming operation is performed, and FIG. 2 shows that leak path 5 is present between first memory element 100 and second memory element 104 that are adjacent to each other. In addition, second memory element 104 is excluded from the targets for a forming operation. Namely, second memory element 104 has a resistance higher than that of first memory element 100.

When a forming operation is performed onto first memory element 100, a forming pulse is applied to first memory element 100 via first select line 108. In this case, when first memory element 100 and second memory element 104 are insulated in a normal way, a potential difference occurs between first top electrode 101 and first bottom electrode 103 of first memory element 100, and the forming operation is completed by applying a desired voltage to first resistive element 102.

On the contrary, when a leak path occurs between first memory element 100 and second memory element 104, that is, when leak path 5 is present between first bottom electrode 103 and second bottom electrode 107, for example, as shown in FIG. 2, second bottom electrode 107 is connected to first select line 108 without passing second resistive element 106 but via first conductive layer 110 and conductor 4. Thus, via leak path 5, the electric potential of first bottom electrode 103 becomes equal to the electric potentials of second bottom electrode 107, conductor 3b, first conductive layer 110, conductor 4, and first select line 108. Accordingly, a potential difference does not occur between first top electrode 101 and first bottom electrode 103 of first memory element 100. As a result, the forming operation is not performed onto first memory element 100 in a normal way. Thus, by detecting that the forming operation cannot be performed in a normal way (forming failure), a presence of leak path 5 can be detected.

Similarly, in the case where a forming pulse is applied to first memory element 100 via second select line 109, leak path 5 can be detected in the same way.

To be more specific, first bottom electrode 103 is connected, via leak path 5, to second bottom electrode 107, conductor 3b, first conductive layer 110, conductor 4, first select line 108, conductor 2a, and first top electrode 101. Thus, the electric potential of first top electrode 101 becomes equal to the electric potentials of first bottom electrode 103 and second select line 109 connected to conductor 2b. Accordingly, a potential difference does not occur between first top electrode 101 and first bottom electrode 103, and therefore, it is possible to detect leak path 5 as a forming failure.

Moreover, in the case of using first memory element 100 as a memory cell and using second memory element 104 as a dummy memory element (first dummy memory element), leak path 5 can be detected in the same way. Note that second memory element 104 used as a dummy memory element is excluded from the targets for a forming operation and has a resistance higher than that of first memory element 100. Second memory element 104 used as a dummy memory cell may be disposed around first memory element 100 used as a memory cell.

Thus, with semiconductor memory device 10 according to the present embodiment, the electric potential of first top electrode 101 becomes equal to the electric potential of first bottom electrode 103, and thereby leak path 5 can be detected. Accordingly, a leak can be found as a trouble, and thus it is possible to prevent the occurrence of malfunction and the degradation in reliability. Moreover, by connecting second bottom electrode 107 to first select line 108 without passing first resistive element 102, it is possible to detect leak path 5 that is present between first memory element 100 and second memory element 104, without changing the resistance state of first memory element 100 to a low resistance state. Thus, with semiconductor memory device 10, it is possible to prevent the occurrence of malfunction and the degradation in reliability.

Note that first conductive layer 110 and second select line 109 are present in the same layer in FIG. 2, however, leak path 5 can be detected even in the case where first conductive layer 110 is disposed in a layer above or below second select line 109. In addition, first conductive layer 110 may include a metal layer and a diffusion layer connected to the metal layer Moreover, in general, first select line 108 is a bit line and second select line 109 is a source line. In the case where a memory cell has a different configuration such as a cross-point memory cell array, second select line 109 is a word line, in some cases.

Note that other plural memory elements, vias, or lines may be disposed adjacent to second memory element 104 of the present embodiment. For example, semiconductor memory device 10 may further include the third memory element (not shown) adjacent to second memory element 104, and second bottom electrode 107 of second memory element 104 may be connected to vertical interconnection layer 4. The term "vertical" here refers to a direction in which first top electrode 101, first resistive element 102, and first bottom electrode 103 are stacked in first memory element 100, or a direction in which second top electrode 105, second resistive element 106, and second bottom electrode 107 are stacked in second memory element 104. In such case, second memory element 104 and the third memory element may be used as dummy memory elements, and thus, second bottom electrode 107 of first dummy memory element (second memory element 104) is connected to vertical interconnection layer 4, via the third bottom electrode (not shown) included in the second dummy memory element (the third memory element). Thus, it is possible to detect leak path 5, as has been described above.

Embodiment 2

Next, Embodiment 2 will be described.

The semiconductor memory device according to the present embodiment differs from semiconductor memory device 10 according to Embodiment 1 in that the former has a diffusion layer instead of first conductive layer 110 described in Embodiment 1.

Figure 3:
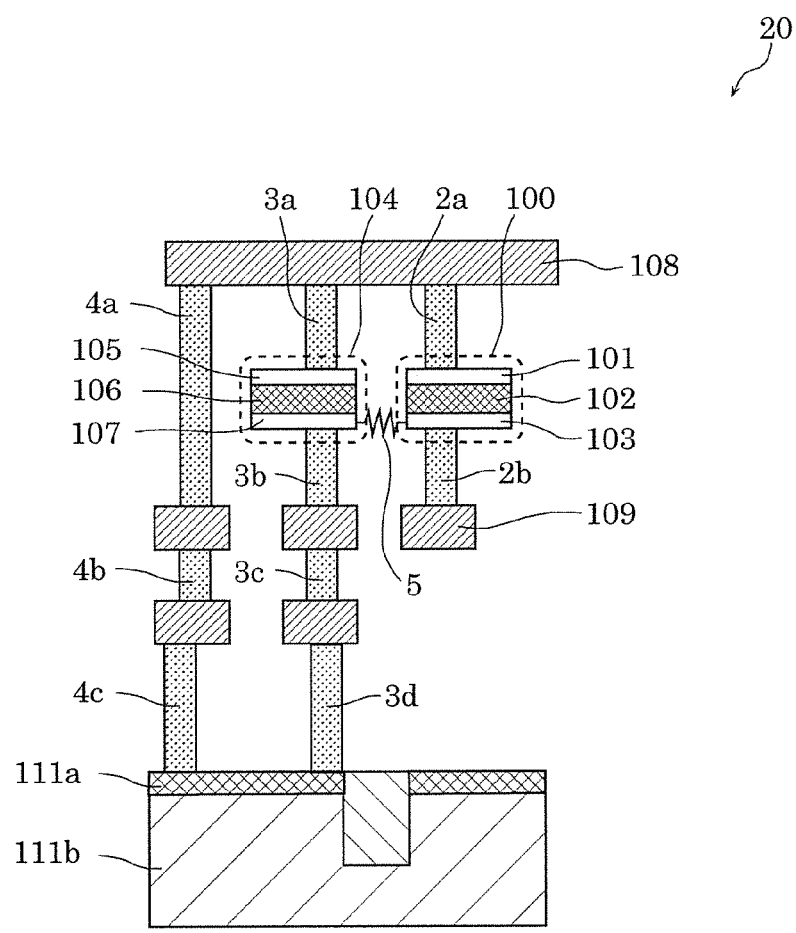
FIG. 3 is a cross-sectional view of a semiconductor memory device according to Embodiment 2 of the present disclosure.

FIG. 3 shows a cross-sectional view of semiconductor memory device 20 according to the present embodiment.

As shown in FIG. 3, semiconductor memory device 20 includes first memory element 100, second memory element 104, first select line 108, second select line 109, conductors 2a, 2b, 3a, 3b, 3c, 3d, 4a, 4b, and 4c, and diffusion layer 111a formed on semiconductor substrate 111b. The configurations of first memory element 100 and second memory element 104 are the same as those described in Embodiment 1, therefore, the detailed descriptions shall be abbreviated. Also, in second memory element 104, second bottom electrode 107 is connected to diffusion layer 111a via conductors 3b, 3c, and 3d. Moreover, diffusion layer 111a is connected to first select line 108 via conductors 4a, 4b, and 4c.

Semiconductor memory device 20 shown in FIG. 3 is in the state before a forming operation is performed, and FIG. 3 shows that leak path 5 is present between first memory element 100 and second memory element 104 that are adjacent to each other. In addition, second memory element 104 is excluded from the targets for the forming operation.

In the case of applying a forming pulse to first memory element 100 via first select line 108, second bottom electrode 107 and first select line 108 are connected not via second resistive element 106 but via conductors 3b, 3c, and 3d, diffusion layer 111a, and conductors 4c, 4b, and 4a. Therefore, a potential difference does not occur between first top electrode 101 and first bottom electrode 103 of first memory element 100. As a result, the forming operation is not performed onto first memory element 100 in a normal way, and thus, leak path 5 can be detected as a forming failure.

Similarly, in the case of applying a forming pulse via second select line 109, a potential difference does not occur between first top electrode 101 and first bottom electrode 103. It is therefore possible to detect leak path 5 as a forming failure.

Moreover, in the case of using first memory element 100 as a memory element of a memory cell and using second memory element 104 as a dummy memory element of a dummy memory cell, leak path 5 can be detected in the same way.

Note that, in general, first select line 108 is equivalent to a bit line and second select line 109 is a source line. In the case where a memory cell has a different configuration such as a cross-point memory cell array, second select line 109 is a word line in some cases. Note that even in the case of disposing other plural memory elements, vias, or lines adjacent to second memory element 104 of the present embodiment, leak path 5 can be detected.

Embodiment 3

Next, Embodiment 3 will be described.

The semiconductor memory device according to the present embodiment differs from semiconductor memory device 10 according to Embodiment 1 in that a metal oxide semiconductor (MOS) transistor is further formed in diffusion layer 111a described in Embodiment 2.

Figure 4:
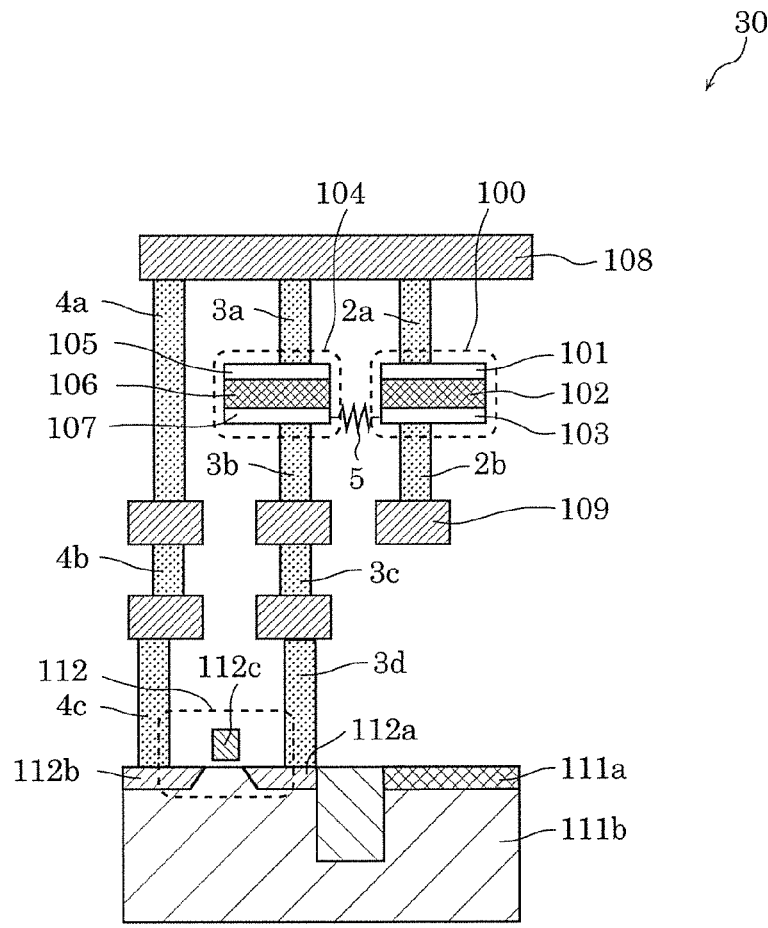
FIG. 4 is a cross-sectional view of a semiconductor memory device according to Embodiment 3 of the present disclosure.

FIG. 4 shows a cross-sectional view of semiconductor memory device 30 according to the present embodiment.

As shown in FIG. 4, semiconductor 30 includes first memory element 100, second memory element 104, first select line 108, second select line 109, conductors 2a, 2b, 3a, 3b, 3c, 3d, 4a, 4b, and 4c, and diffusion layer 111a formed on semiconductor substrate 111b. MOS transistor 112 is further formed in diffusion layer 111a.

The configurations of first memory element 100 and second memory element 104 are the same as those described in Embodiment 1, therefore, the detailed descriptions shall be abbreviated. In addition, in second memory element 104, second bottom electrode 107 is connected to MOS transistor 112 formed in diffusion layer 111a, via conductors 3b, 3c, and 3d which are formed in a layer lower than second bottom electrode 107. Moreover, MOS transistor 112 is connected to first select line 108 via conductors 4a, 4b, and 4c.

To be more specific, MOS transistor 112 includes source-drain electrodes 112a and 112b, and a gate electrode 112c. One of source-drain electrodes 112a and 112b is connected to a source and the other is connected to a drain. Source-drain electrode 112a is connected to conductor 3d and source-drain electrode 112b is connected to conductor 4c.

Semiconductor memory device 30 shown in FIG. 4 is in the state before a forming operation is performed, and FIG. 4 shows that leak path 5 is present between first memory element 100 and second memory element 104 that are adjacent to each other. In addition, second memory element 104 is excluded from the targets for the forming operation.

In the case of applying a forming pulse to first memory element 100 via first select line 108, second bottom electrode 107 and first select line 108 are connected not via second resistive element 106 but via conductors 3b, 3c, and 3d, MOS transistor 112, and conductors 4c, 4b, and 4a. Therefore, a potential difference does not occur between first top electrode 101 and first bottom electrode 103 of first memory element 100. As a result, the forming operation is not performed onto first memory element 100 in a normal way, and thus, leak path 5 can be detected as a forming failure.

Similarly, in the case of applying a forming pulse via second select line 109, a potential difference does not occur between first top electrode 101 and first bottom electrode 103. It is therefore possible to detect leak path 5 as a forming failure.

Moreover, in the case of using first memory element 100 as a memory element of a memory cell and using second memory element 104 as a dummy memory element of a dummy memory cell, leak path 5 can be detected in the same way. Note that, in general, first select line 108 is a bit line and second select line 109 is a source line. In the case where a memory cell has a different configuration such as a cross-point memory cell array, second select line 109 is a word line in some cases.

Note that even in the case of disposing other plural memory elements, vias, or lines adjacent to second memory element 104 of the present embodiment, leak path 5 can be detected.

Embodiment 4

Next, Embodiment 4 will be described.

The semiconductor memory device according to the present embodiment differs from semiconductor memory device 10 according to Embodiment 1 in that the second bottom electrode has an extension portion and is connected to first select line via an interconnection layer connected to the extension portion. The extension portion extends to a side opposite the first memory element FIG. 5 shows a cross-sectional view of semiconductor memory device 40 according to the present embodiment.

Figure 5:
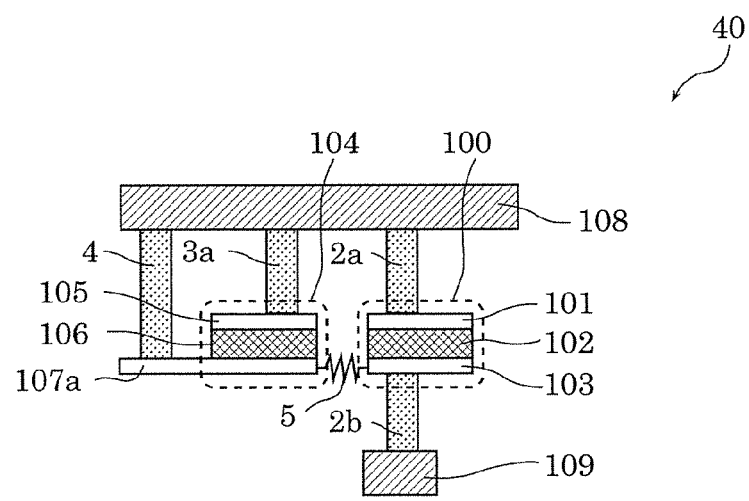
FIG. 5 is a cross-sectional view of a semiconductor memory device according to Embodiment 4 of the present disclosure.

As shown in FIG. 5, semiconductor memory device 40 includes first memory element 100, second memory element 104, first select line 108, second select line 109, and conductors 2a, 2b, 3a, and 4. Second bottom electrode 107a is formed so as to extend to a side opposite to the side where first memory element 100 is formed. Namely, second bottom electrode 107a is larger in size than second top electrode 105 and resistive element 106 and has an extension portion extending from second top electrode 105 and second resistive element 106 to a side opposite the side where first memory element 100 is formed. Then, a top surface of this extension portion and first select line 108 are connected by conductor 4.

Semiconductor memory device 40 shown in FIG. 5 is in the state before a forming operation is performed, and FIG. 5 shows that leak path 5 is present between first memory element 100 and second memory element 104 that are adjacent to each other. In addition, second memory element 104 is excluded from the targets for the forming operation.

In the case of applying a forming pulse to first memory element 100 via first select line 108, second bottom electrode 107 is connected to first select line 108 not via second resistive element 106 but via conductor 4. Therefore, a potential difference does not occur between first top electrode 101 and first bottom electrode 103 of first memory element 100. As a result, the forming operation is not performed onto first memory element 100 in a normal way, and thus, leak path 5 can be detected.

Similarly, in the case of applying a forming pulse via second select line 109, a potential difference does not occur between first top electrode 101 and first bottom electrode 103. It is therefore possible to detect leak path 5 as forming failure.

Moreover, in the case of using first memory element 100 as a memory element of a memory cell and using second memory element 104 as a dummy memory element of a dummy memory cell, leak path 5 can be detected in the same way.

Note that, in general, first select line 108 is a bit line and second select line 109 is a source line. In the case where a memory cell has a different configuration such as a cross-point memory cell array, second select line 109 is a word line in some cases. Note that even in the case of disposing other plural memory elements, vias, or lines adjacent to second memory element 104 of the present embodiment, leak path 5 can be detected.

Embodiment 5

Next, Embodiment 5 will be described.

The semiconductor memory device according to the present embodiment differs from semiconductor memory device 10 according to Embodiment 1 in that the first memory element includes a diode between the first resistive element and the first bottom electrode.

Figure 6:
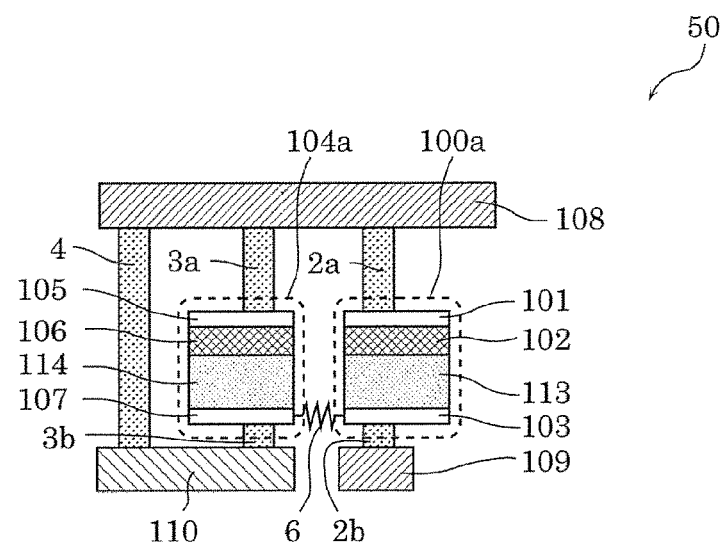
FIG. 6 is a cross-sectional view of a semiconductor memory device according to Embodiment 5 of the present disclosure.

FIG. 6 shows a cross-sectional view of semiconductor memory device 50 according to the present embodiment.

As shown in FIG. 6, semiconductor memory device 50 includes first memory element 100a, second memory element 104, first select line 108, second select line 109, conductors 2a, 2b, 3a, 3b, and 4, and first conductive layer 110.

First memory element 100a has first top electrode 101, first bottom electrode 103, first resistive element 102 disposed between first top electrode 101 and first bottom electrode 103 in contact with first top electrode 101, and diode 113 disposed between first resistive element 102 and first bottom electrode 103. Second memory element 104 has second top electrode 105, second bottom electrode 107, and second resistive element 106 disposed between second top electrode 105 and second bottom electrode 107.

Semiconductor memory device 50 shown in FIG. 6 is in the state before a forming operation is performed, and FIG. 6 shows that leak path 6 is present between first memory element 100a and second memory element 104 that are adjacent to each other. To be more specific, leak path 6 is present between diode 113 of first memory element 100a and second bottom electrode 107 of second memory element 104. In addition, second memory element 104 is excluded from the targets for the forming operation.

In addition, second memory element 104 is a cross-point memory element including diode 113 in a layer lower than second resistive element 106. Note that each of first memory element 100a and second memory element 104 has a configuration to include diode 113 in a layer lower than first resistive element 102 and second resistive element 106. Moreover, in the present embodiment, diode 113 is disposed between first resistive element 102 and first bottom electrode 103 in first memory element 100a. However, diode 113 may be, however, disposed between first bottom electrode 103 and second select line 109 or may be provided in a different location. Furthermore, the disposition of diode 113 shall not be limited to second memory element 104, and diode 113 may be disposed in first memory element 100a.

In the case of applying a forming pulse to first memory element 100a via first select line 108, second bottom electrode 107 and first select line 108 are connected not via second resistive element 106 but via first conductive layer 110 and conductor 4. Therefore, a potential difference does not occur between first top electrode 101 and first bottom electrode 103 of first memory element 100a. As a result, the forming operation is not performed onto first memory element 100a in a normal way, and leak path 6 can be detected as a forming failure.

Similarly, in the case of applying a forming pulse via second select line 109, a potential difference does not occur between first top electrode 101 and first bottom electrode 103. It is therefore possible to detect leak path 6 as a forming failure.

Moreover, in the case of using first memory element 100a as a memory element of a memory cell and using second memory element 104 as a dummy memory element of a dummy memory cell, leak path 6 can be detected in the same way.

Note that first conductive layer 110 and second select line 109 are present in the same layer, however, leak path 6 can be detected even in the case where first conductive layer 110 is disposed in a layer above or below second select line 109. Note that, in general, first select line 108 is a bit line and second select line 109 is a source line. In the case where a memory cell has a different configuration such as a cross-point memory cell array, second select line 109 is a word line in some cases. Note that even in the case of disposing other plural memory elements, vias, or lines adjacent to second memory element 104 of the present embodiment, leak path 6 can be detected.

Embodiment 6

Next, Embodiment 6 will be described.

The semiconductor memory device according to the present embodiment differs from semiconductor memory device 30 according to Embodiment 3 in that the former includes a plurality of the MOS transistors described in Embodiment 3.

Figure 7:
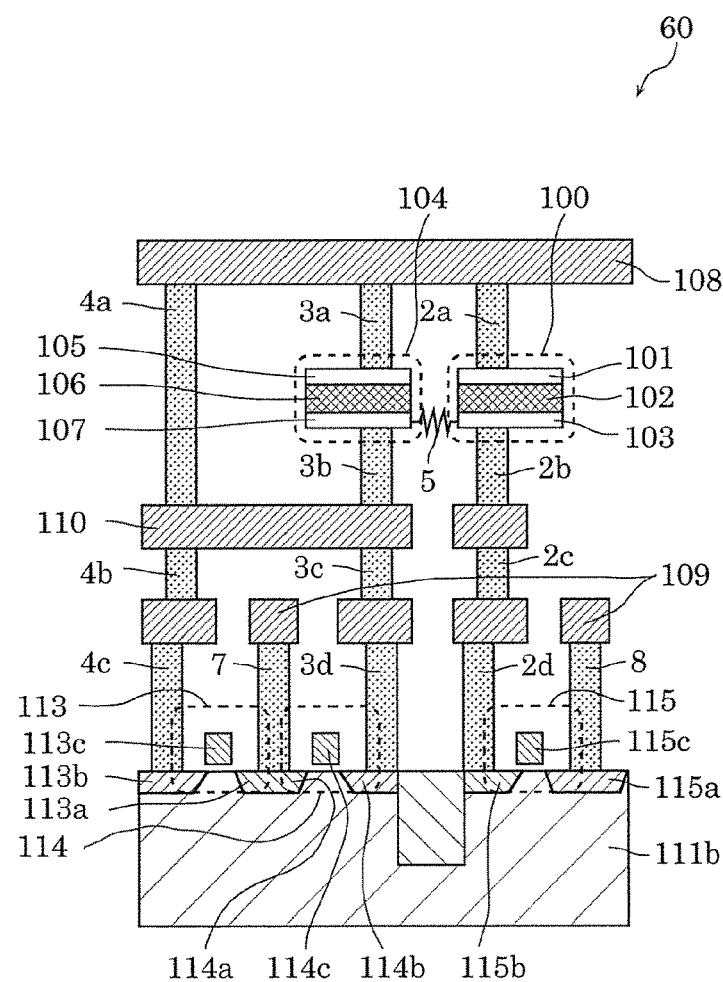
FIG. 7 is a cross-sectional view of a semiconductor memory device according to Embodiment 6 of the present disclosure.

FIG. 7 shows a cross-sectional view of semiconductor memory device 60 according to the present embodiment.

As shown in FIG. 7, semiconductor memory device 60 includes first memory element 100, second memory element 104, first select line 108, second select line 109, conductors 2a, 2b, 2c, 2d, 3a, 3b, 3c, 3d, 4a, 4b, 4c, 7, and 8, and diffusion layer 111a (see FIG. 4) formed on semiconductor substrate 111b. In diffusion layer 111a, MOS transistors 113, 114 and 115 are formed. Note that diffusion layer 111a is not shown in FIG. 7.

The configurations of first memory element 100 and second memory element 104 are the same as those described in Embodiment 1, therefore, the detailed descriptions shall be abbreviated. In addition, in second memory element 104, second bottom electrode 107 is connected, via conductors 3b, 3c, and 3d, to MOS transistor 114 formed in diffusion layer 111a. Moreover, MOS transistor 113 is connected to first select line 108 via conductors 4a, 4b, and 4c.

To be more specific, MOS transistor 113 includes source-drain electrodes 113a and 113b, and gate electrode 113c. One of source-drain electrodes 113a and 113b is connected to a source and the other is connected to a drain. Source-drain electrode 113a is connected to conductor 7 and source-drain electrode 113b is connected to conductor 4c.

In addition, MOS transistor 114 includes source-drain electrodes 114a and 114b, and gate electrode 114c. Source-drain electrodes 114a and 114b are formed in a consecutive manner. One of source-drain electrodes 114a and 114b is connected to a source and the other is connected to a drain. Source-drain electrode 114a is connected to conductor 7 and source-drain electrode 114b is connected to conductor 3d.

Moreover, in first memory element 100, first bottom electrode 103 may be connected, via conductors 2b, 2c, and 2d, to MOS transistor 115 formed on diffusion layer 111a.

More precisely, MOS transistor 115 includes source-drain electrodes 115a and 115b, and gate electrode 115c. One of source-drain electrodes 115a and 115b is connected to a source and the other is connected to a drain. Source-drain electrode 115a is connected to conductor 8 and source-drain electrode 115b is connected to conductor 2d.

Semiconductor memory device 60 shown in FIG. 7 is in the state before a forming operation is performed, and FIG. 7 shows that leak path 5 is present between first memory element 100 and second memory element 104 that are adjacent to each other. In addition, semiconductor memory device 60 shown in FIG. 7 is a 1T1R memory cell. FIG. 7 shows the case where memory elements in the outer periphery of the memory cell are not formed, and also shows that MOS transistor 113 paired with one of the memory elements that have not been formed is formed.

In the case of applying a forming pulse to first memory element 100 via first select line 108, second bottom electrode 107 and first select line 108 are connected not via second resistive element 106 but via MOS transistors 113 and 114 that are in conductive state. Therefore, a potential difference does not occur between first top electrode 101 and first bottom electrode 103 of first memory element 100. As a result, the forming operation is not performed onto first memory element 100 in a normal way, and leak path 5 can be detected as a forming failure.

Similarly, in the case of applying a forming pulse via second select line 109, a potential difference does not occur between first top electrode 101 and first bottom electrode 103. It is therefore possible to detect leak path 5 as forming failure.

Moreover, in the case of using first memory element 100 as a memory element of a memory cell and using second memory element 104 as a dummy memory element of a dummy memory cell, leak path 5 can be detected in the same way.

Note that, in general, first select line 108 is a bit line and second select line 109 is a source line. In the case where a memory cell has a different configuration such as a cross-point memory cell array, second select line 109 is a word line in some cases. Note that even in the case of disposing other plural memory elements, vias, or lines adjacent to second memory element 104 of the present embodiment, leak path 5 can be detected.

Although the semiconductor memory device according to each of the embodiments of the present disclosure has been described above, the present disclosure is not limited to these embodiments.

For example, in the abovementioned embodiments, a ReRAM is used as an example of the semiconductor memory device, however, the semiconductor memory device shall not be limited to the ReRAM and a memory device using a different memory may be used instead. In addition, the memory cell may be a 1T1R memory cell including a transistor. The memory cell shall not be limited to such 1T1R memory cell, and may have a different configuration. For example, a 1D1R memory cell including a diode may be used instead.

Moreover, the memory elements may include a memory cell and a dummy memory cell or may not include a dummy memory cell.

Moreover, the conductive layer may be a metal layer or a diffusion layer, or a metal layer to which a diffusion layer is connected. Moreover, a transistor may be formed in a diffusion layer. Furthermore, the transistor shall not be limited to a MOS transistor and a different transistor may be used instead.

Moreover, the present disclosure shall not be limited to the abovementioned embodiments. The present disclosure may include, as one or more aspects of the present disclosure without departing from the principles and spirit thereof, various modifications those skilled in the art could think of, and an embodiment made by combination(s) of the structural elements described in these embodiments.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be utilized in a semiconductor memory device, and is particularly useful as a memory in an electronic device, such as an IC card, for which high reliability is demanded.

What is claimed is:

1. A semiconductor memory device comprising:
   a plurality of memory elements each having a top electrode, a bottom electrode disposed below the top electrode, and a resistive element disposed between the top electrode and the bottom electrode;
   a first select line;
   a second select line; and
   a conductive layer disposed in a different layer from the first select line and separated from the second select line,
   wherein a first memory element among the plurality of memory elements has a first top electrode as the top electrode, a first bottom electrode as the bottom electrode, and a first resistive element as the resistive element of the first memory element,
   the first top electrode is connected to the first select line,
   the first bottom electrode is connected to the second select line,
   a second memory element among the plurality of memory elements, which is disposed adjacent to the first memory element, has a second top electrode as the top electrode, a second bottom electrode as the bottom electrode, and a second resistive element as the resistive element of the second memory element,
   the second top electrode is connected to the first select line, and
   the second bottom electrode is connected to the first select line via the conductive layer without passing the first resistive element.

2. The semiconductor memory device according to claim 1,
   wherein the first memory element is a memory cell which stores data by maintaining a high resistance state or a low resistance state,
   the second memory element is a dummy memory cell which does not store data, and
   the dummy memory cell is disposed in a periphery of the memory cell.

3. The semiconductor memory device according to claim 1, wherein the conductive layer is a diffusion layer.

4. The semiconductor memory device according to claim 3, wherein a metal oxide semiconductor (MOS) transistor is disposed in the diffusion layer, and the second bottom electrode and the first select line are connected via the MOS transistor.

5. The semiconductor memory device according to claim 1, wherein the conductive layer is a metal layer.

6. The semiconductor memory device according to claim 1, wherein the conductive layer comprises a metal layer and a diffusion layer connected to the metal layer.

7. The semiconductor memory device according to claim 1, wherein the second bottom electrode has an extension portion and is connected to the first select line via an interconnection layer connected to the second bottom electrode in the extension portion, the extension portion extending to a side opposite a side on which the first memory element is disposed.

8. The semiconductor memory device according to claim 7,
further comprising:
a third memory element which is adjacent to the second memory element on the side opposite the side on which the first memory element is disposed,
wherein the second bottom electrode of the second memory element is connected to the interconnection layer via a third bottom electrode included in the third memory element.

9. The semiconductor memory device according to claim 8, wherein the third memory element is a dummy memory cell which does not store data.

10. The semiconductor memory device according to claim 1, wherein the first select line and the conductive layer are connected by a vertical interconnection layer.

11. The semiconductor memory device according to claim 1, wherein the second memory element has a resistance higher than a resistance of the first memory element.

12. The semiconductor memory device according to claim 1, wherein the first memory element further has a diode between the first bottom electrode and the first resistive element.

* * * * *